(12) United States Patent
Shinohara

(10) Patent No.: US 7,342,523 B2
(45) Date of Patent: Mar. 11, 2008

(54) TESTING APPARATUS

(75) Inventor: Makoto Shinohara, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/387,441

(22) Filed: Mar. 23, 2006

(65) Prior Publication Data
US 2006/0214828 A1    Sep. 28, 2006

(30) Foreign Application Priority Data
Mar. 23, 2005   (JP) .............................. 2005-084596

(51) Int. Cl.
*H03M 1/10*    (2006.01)
(52) U.S. Cl. ..................................... 341/120
(58) Field of Classification Search ................ 341/120, 341/144, 155, 111, 118; 702/127, 108; 714/738
See application file for complete search history.

(56) References Cited
U.S. PATENT DOCUMENTS 4,758,781 A * 7/1988 Ueno et al. ................ 324/73.1
6,377,902 B1 * 4/2002 Eckert ......................... 702/127
6,513,138 B1 * 1/2003 Ohsawa ....................... 714/738

\* cited by examiner

*Primary Examiner*—Peguy JeanPierre
(74) *Attorney, Agent, or Firm*—Osha-Liang LLP

(57) ABSTRACT

To provide a testing apparatus having a function of testing a D/A converter and so forth with a reduced testing time. The testing apparatus tests a converter having functionality of converting an input signal and outputting the signal thus converted. The testing apparatus comprises: a pattern generator which generates an input signal having a predetermined cycle; a clock generator which generates a measurement clock having a predetermined cycle; a measurement unit which receives the measurement clock, and sequentially measures the values of the output signal, synchronously with the measurement clock; and a storage unit which stores, at different corresponding addresses, the values thus sequentially measured by the measurement unit.

3 Claims, 4 Drawing Sheets

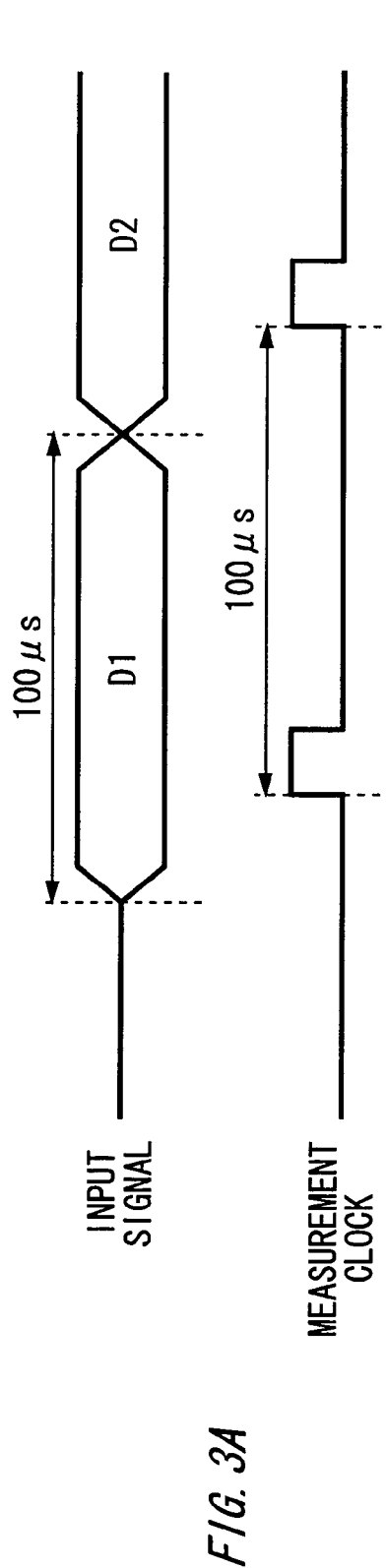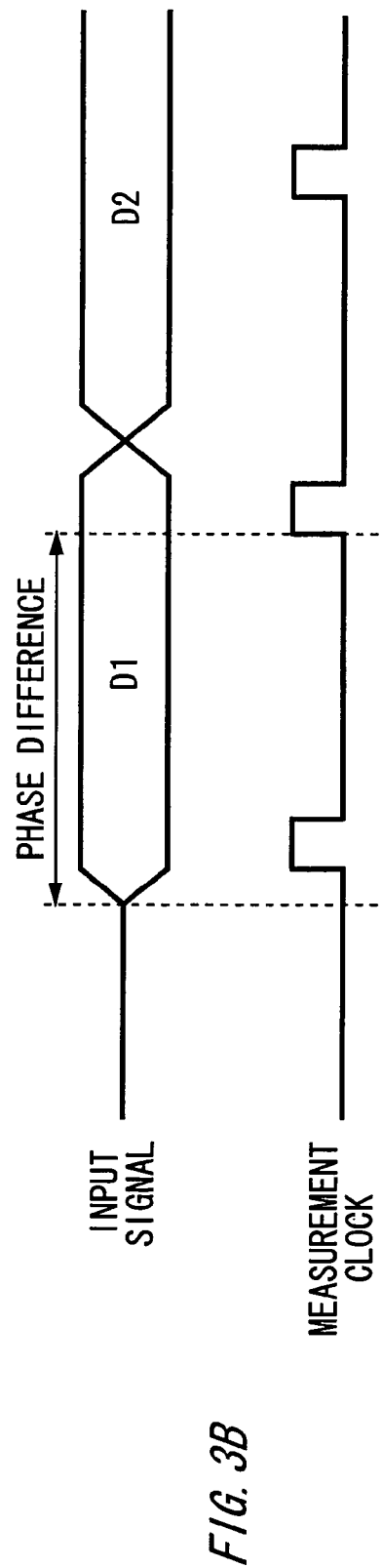
FIG. 3A
FIG. 3B

TESTING APPARATUS

CROSS REFERENCE TO RELATED APPLICATION

The present application claims priority from a Japanese Patent Application(s) No. 2005-084596 filed on Mar. 23, 2005, the contents of which are incorporated herein by reference.

BACKGROUND OF THE INVENTION

1. Field of the Invention

The present invention relates to a testing apparatus for testing a converter which has functionality of converting an input signal and of outputting the converted signal.

2. Related Art

Conventionally, when a converter such as A/D converter, D/A converter, and so forth is tested, a predetermined input signal is input to the converter, and detection is made whether or not the output signal of the converter matches a predetermined valve. Additionally, in order to test the converter with high precision, there is a need to input tens to tens of thousand of input signals patterns to the converter.

Conventional testing apparatuses include a measurement unit for measuring a voltage valve of the output signal of a D/A converter, and a resistor for storing the value measured by the measurement unit, for example. With such an arrangement, the testing apparatus stops application of the input signal, and reads out the voltage value stored in the resistor, every time the output signal level of the D/A converter is determined.

As of now, no prior art documents have been recognized, and accordingly description of prior art documents will be abbreviated here.

However, with regard to converters such as D/A converters and so forth, the converter needs to be initialized prior to the input of a new input signal following stopping of application of the previous input signal.

That is to say, the converter needs to be initialized every time the input signal varies. Accordingly, such a test of the converter using tens to tens of thousands of input signal patterns requires an extremely long testing time.

Accordingly, it is an object of the present invention to provide a testing apparatus having a function of solving the aforementioned problems. This object is achieved by combining the features described in the independent claims in the Claims. Also, the dependent claims lay forth further advantageous specific examples of the present invention.

SUMMARY OF THE INVENTION

In order to solve the aforementioned problems, according to a first aspect of the present invention, a testing apparatus, which tests a converter having functionality of converting an input signal and outputting the signal thus converted, comprises: a pattern generator which generates an input signal having a predetermined cycle; a clock generator which generates a measurement clock having a predetermined cycle; a measurement unit which receives the measurement clock, and sequentially measures the values of the output signal, synchronously with the measurement clock; and a storage unit which stores, at different corresponding addresses, the values thus sequentially measured by the measurement unit.

The testing apparatus may further include a phase difference detection unit which detects the phase difference between the pulse of the input signal and the pulse of the measurement clock corresponding to the input signal pulse for each pulse. With such an arrangement, in the event that the phase difference between the pulse of the input signal and the pulse of the measurement clock is greater than a predetermined value, the storage unit does not store the value of the output signal measured by the measurement unit according to this particular pulse of the measurement clock.

The testing apparatus may further include a phase difference detection unit which detects the phase difference between the pulse of the input signal and the pulse of the measurement clock corresponding to the input signal pulse for each pulse. With such an arrangement, in the event that the phase difference between the pulse of the input signal and the pulse of the measurement clock is greater than a predetermined value, the storage unit stores the information which indicates that the value of the output signal is a dummy value, in correlation with the value of the output signal measured by the measurement unit according to this particular pulse of the measurement clock.

The testing apparatus may further include a determination unit which determines whether or not each value of the output signal stored in the storage unit is within a predetermined range determined beforehand corresponding to the input signal having a predetermined pattern. With such an arrangement, in the event that the pattern generator has determined that the values of the output signal are not within the range, the pattern generator further input the input signal having the predetermined pattern to the converter.

Note that the above outline of the invention is not a comprehensive list of all necessary features of the present invention, and that sub-combinations of these feature groups may also be inventions.

BRIEF DESCRIPTION OF THE DRAWINGS

FIGS. 3A-B are diagrams which show an example of the waveforms of an input signal and a measurement clock.

DETAILED DESCRIPTION OF THE INVENTION

The present invention will now be described by way of embodiments; however, it should be understood that the following embodiments do not restrict the invention according to the Claims, and that combinations of features described in the embodiments are not necessarily indispensable to the present invention.

Figure 1:
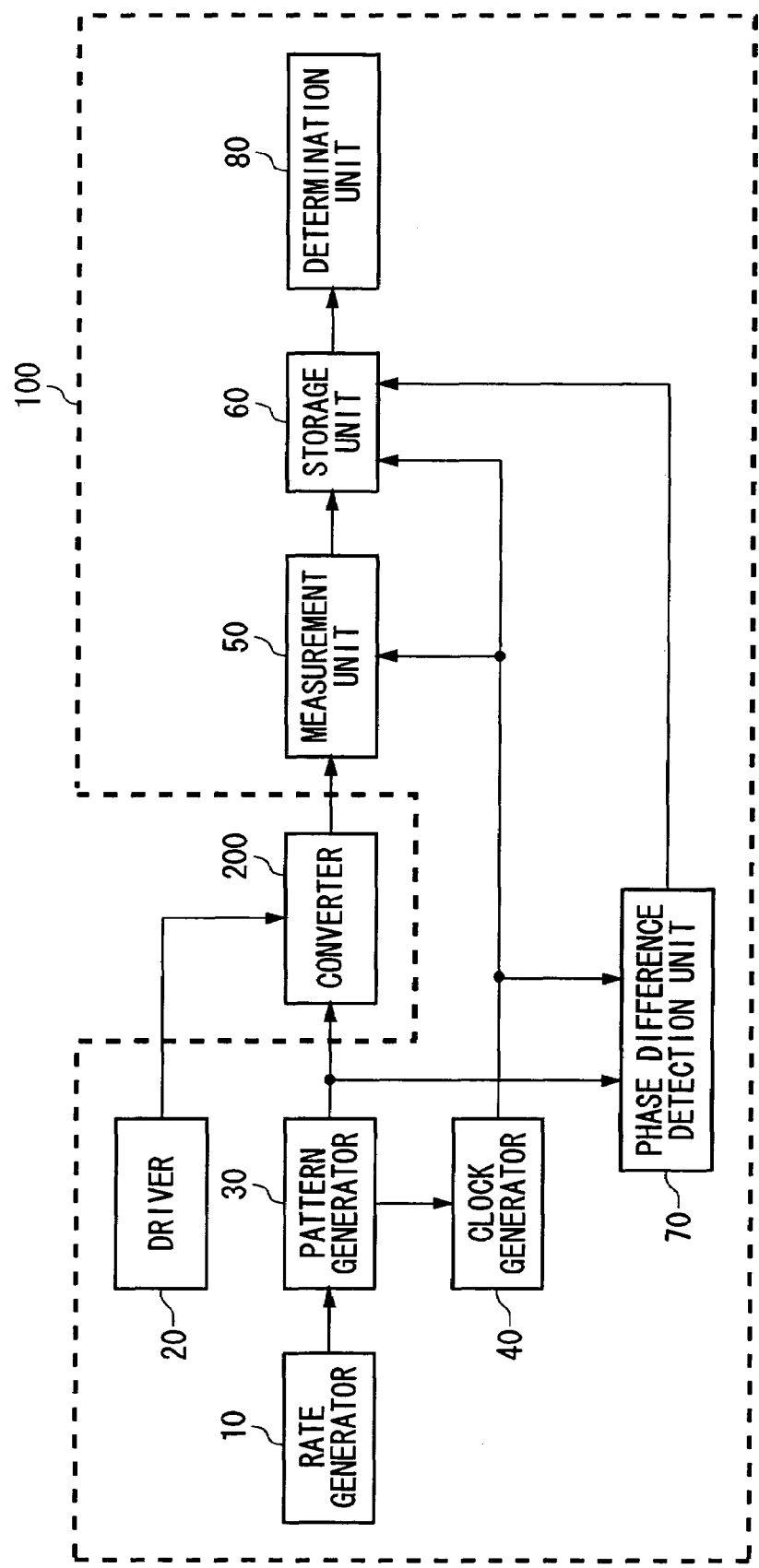
FIG. 1 is a diagram which shows an example of a configuration of a testing apparatus 100 according to an embodiment of the present invention.

FIG. 1 is a diagram which shows an example of a configuration of a testing apparatus 100 according to an embodiment of the present invention. The testing apparatus 100 is an apparatus for testing a converter 200 having functionality of converting an input signal and outputting the converted signal. The testing apparatus 100 includes a rate generator 10, driver 20, pattern generator 30, clock generator 40, measurement unit 50, and a storage unit 60. The converter 200 is a D/A converter or A/D converter, for example.

The driver 20 generates and supplies source power, driving clock, and the like, for operating the converter 200. The rate generator 10 generates a rate clock for operating the pattern generator 30.

The pattern generator 30 operates in response to the rate clock, and generates an input signal having a predetermined cycle. For example, the input signal sequentially exhibits digital values to be sequentially input to the converter 200 at the aforementioned predetermined cycle. The pattern generator 30 receives a program for generating the aforementioned input signal, and generates a predetermined pattern of an input signal by executing the aforementioned program according to the rate clock. For example, the pattern generator 30 generates an input signal which exhibits digital values sequentially increasing in increments of the aforementioned cycle. The cycle of the input signal may be determined according to the aforementioned program. The driver 20 continues the supply of the source power, driving clock, and so forth, until the converter 200 outputs the output signal corresponding to the input signal after completion of input of the input signal, which has been generated according to the aforementioned program, to the converter 200.

The clock generator 40 generates a measurement clock having approximately the same cycle as that of the input signal. The cycle of the measurement clock, which is to be generated by the clock generator 40, may be set beforehand for the clock generator 40. Also, the cycle of the measurement clock may be transmitted to the clock generator 40 from the pattern generator 30. Furthermore, the pattern generator 30 may supply a trigger signal to the clock generator 40, which instructs the clock generator 40 to start generating the measurement clock.

The measurement unit 50 receives the measurement clock. Then, the measurement unit 50 sequentially makes a measurement of the values of the output signal, synchronously with the measurement clock thus received.

For example, the measurement unit 50 sequentially detects the voltage values of the output signal for each pulse phase of the measurement clock. Also, the testing apparatus 100 may further include a control unit for supplying a trigger signal to the measurement unit 50, which instructs the measurement unit 50 to start measuring the output signal. Also, the pattern generator 30 may generate the aforementioned trigger signal.

The storage unit 60 sequentially stores the values thus sequentially measured by the measurement unit 50, at different corresponding addresses. An arrangement may be made in which the storage unit 60 receives the measurement clock, and sequentially generates the different corresponding addresses in response to the measurement clock. A determination unit 80 determines the quality of the converter 200 based upon the values stored in the storage unit 60.

With the testing apparatus 100 according to the present embodiment, the input signal and the measurement clock have approximately the same cycle. Accordingly, the cycle of the output signal from the converter 200 is approximately the same as the measurement cycle of the measurement unit 50. This enables the measurement unit 50 to continuously detect the voltage values of the output signal for each cycle while continuously inputting the input signal to the converter 200.

This allows the input signal to be continuously supplied to the converter 200 while sequentially changing the value of the input signal. With such an arrangement, the input signal is continuously supplied. This offers measurement without any initializing step for the converter 200, thereby reducing the testing time.

Furthermore, a phase difference detection unit 70 detects the phase difference between the input signal pulse and the corresponding measurement clock pulse for each pulse. In the event that the phase difference thus detected is greater than a predetermined value, the storage unit 60 does not necessarily have to store the value of the output signal measured by the measurement unit 50 in response to this particular pulse. Description will be made later regarding the operations of the phase difference detection unit 70 and the storage unit 60 with reference to FIGS. 3A-B.

Figure 2:
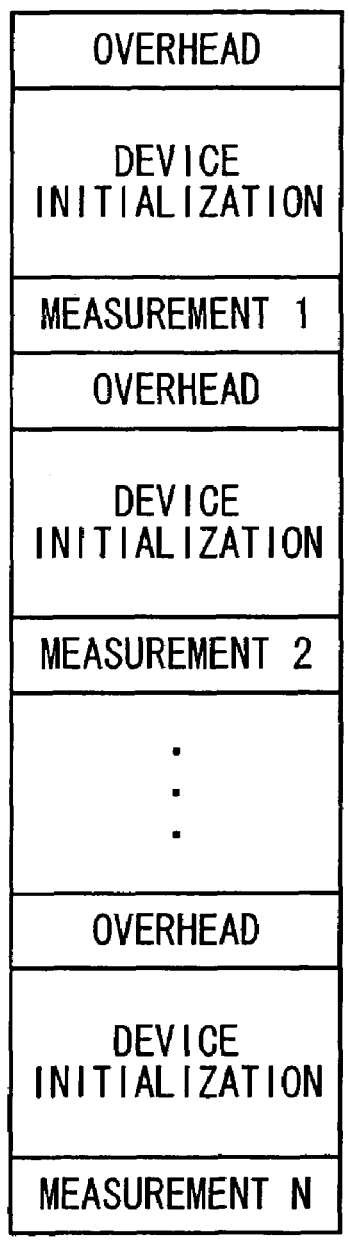
FIG. 2 is a diagram for making a comparison between the operation of a conventional testing apparatus and the operation of the testing apparatus 100.
Figure 2:
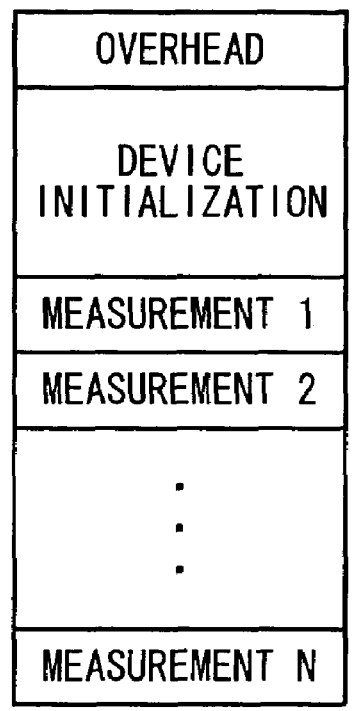

FIG. 2 is a diagram for making a comparison between the operation of a conventional testing apparatus and the operation of the testing apparatus 100. With the conventional testing apparatus, the input signal is not continuously input to a D/A converter or the like. With such an arrangement, a device such as a D/A converter or the like needs to be initialized every time that a different signal value is input to the D/A converter or the like. Specifically, let us consider a case in which N kinds of signal values are sequentially input to the D/A converter or the like. In this case, the measurement requires N instances of initialization for the device such as a D/A converter or the like. This requires an extremely long testing time.

On the other hand, the testing apparatus 100 has a function of continuously and sequentially inputting input signals, which exhibit N kinds of signal values, to the D/A converter or the like. With such an arrangement, the measurement needs no initialization for the D/A converter or the like all the way to the end of the measurement, except for the initialization of the D/A converter or the like before application of the input signal.

This means that the testing apparatus 100 allows the device initialization time corresponding to N−1 instances of the initialization to be eliminated, thereby reducing the testing time.

FIGS. 3A-B are diagrams which show an example of the waveforms of an input signal and a measurement clock. Description will be made regarding an example of the input signal and the measurement clock both having a cycle time of 100 .mu.S. As shown in FIG. 3A, the clock generator 40 generates a measurement clock with a predetermined phase difference with respect to the input signal. Specifically, the clock generator 40 generates a measurement clock having the phase difference with respect to the input signal, which provides a margin for a setup time or hold time to the measurement unit 50.

However, in some cases, the phase difference between the measurement clock pulse and the corresponding input signal pulse deviates from a predetermined range due to errors of the cycles of the input signal and the measurement clock, or the like. An arrangement may be made in which the phase difference detection unit 70 detects the phase difference between the measurement clock pulse and the input signal pulse for each pulse. With such an arrangement, in the event that the phase difference thus detected is greater than a predetermined value, the storage unit 60 is controlled so as to not store the value of the output signal measured by the measurement unit 50 according to this particular pulse.

In this case, the pattern generator 30 may continuously output the data value corresponding to this particular pattern until the phase difference becomes smaller than the predetermined value.

On the other hand, let us consider a case in which the cycle of the measurement clock is smaller than that of the input signal as shown in FIG. 3B. In some cases, such a situation leads to duplicate measurement of the same data of the input signal. Even in such a situation, with the present embodiment, the phase difference detection unit 70 controls the storage unit 60 based upon the detected phase difference, thereby preventing redundant data from being stored in the storage unit 60.

Also, an arrangement may be made in which, in the event that the phase difference between the input signal pulse and the measurement clock pulse is greater than a predetermined value, the storage unit 60 stores the information which indicates this particular output signal is a dummy signal, in correlation with the output signal measured by the measurement unit in response to this particular pulse of the measurement clock.

Figure 4A:
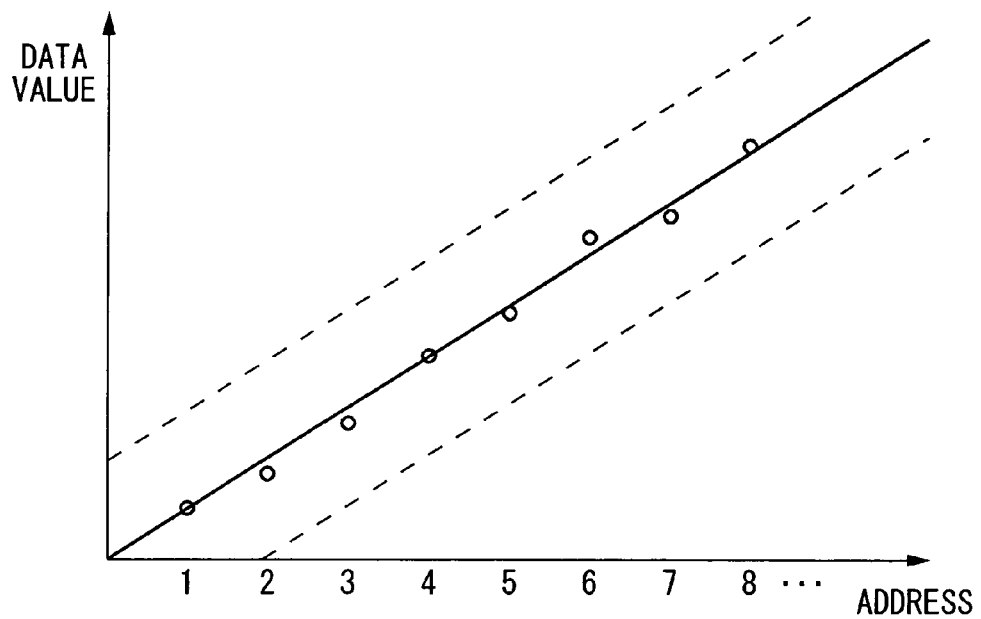
FIGS. 4A-B are diagrams which show an example of the operation of a determination unit 80.
Figure 4B:
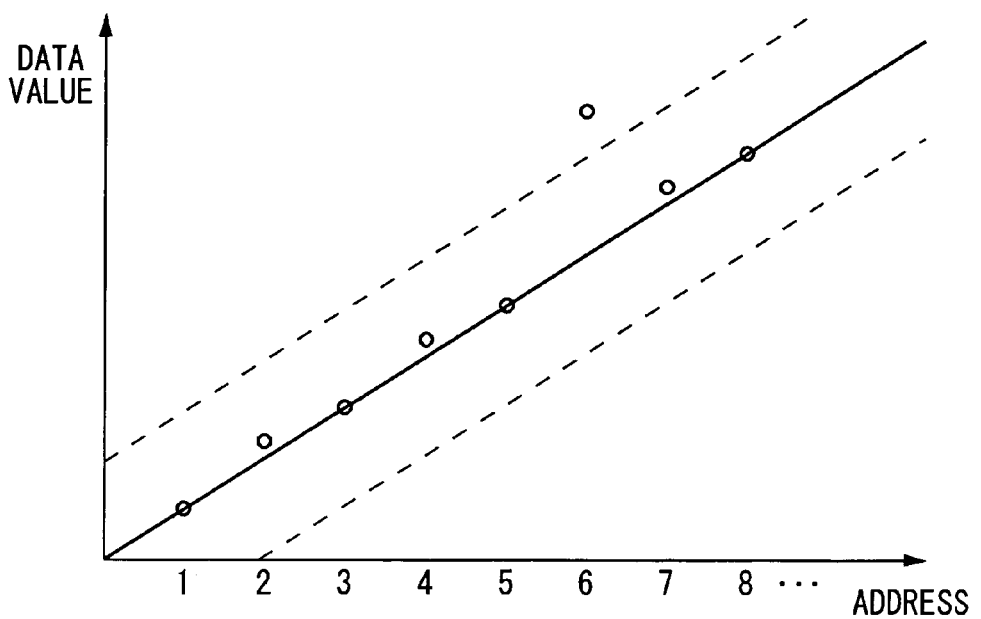

FIGS. 4A-B are diagrams which show an example of the operation of a determination unit 80. In FIGS. 4A-B, the horizontal axis represents the address of the storage unit 60. On the other hand, the vertical axis represents the data value stored at each address. With the present example, the pattern generator 30 generates an input signal which exhibits digital values sequentially increasing by a predetermined value in increments of a predetermined cycle. On the other hand, the storage unit 60 sequentially stores the values measured by the measurement unit 50 in the order from the first address.

In a case that the converter 200 is operating properly, the data values stored in the storage unit 60 can be linearly approximated as shown in FIG. 4A. On the other hand, in a case that the converter 200 is not operating properly, the data values stored in the storage unit 60 cannot be linearly approximated.

The determination unit 80 determines whether or not each value of the output signal, which has been stored in the storage unit 60 corresponding to the input signal, is within a predetermined range. The aforementioned range may be varied for each set of the addresses corresponding to the input signal pattern. For example, the aforementioned range may be determined with a line, having a predetermined inclination, as a reference.

Also, in the event that the determination unit 80 has determined that the values of the output signal are not within the aforementioned range, the pattern generator 30 further inputs the same pattern input signal to the converter 200, again. That is to say, the converter is repeatedly tested using the same pattern input signal. Such an arrangement having like function is advantageous as follows. Let us consider a case in which the converter 200 is acceptable, but the data values are not within the aforementioned range due to noise or the like. Even in such a situation, with such an arrangement, the converter 200 is repeatedly tested. This offers a high-precision test of the converter 200 without being affected by noise or the like.

Also, in the event that the determination unit 80 has determined that the output values are not within the predetermined range, the pattern corresponding to the values of the output signal which do not within the predetermined range is extracted from the input signal input to the converter 200, and the pattern thus extracted is further input to the converter 200.

While the present invention has been described above by way of embodiments, the technical scope of the present invention is not restricted to the description of the embodiments above. Various modifications and improvements can be made to the above embodiments, which can be clearly understood by those skilled in this art. It is clearly understood from the Claims that arrangements obtained by such modifications or improvements are also within the technical scope of the present invention.

As can be clearly understood from the above description, the present invention provides a test of a D/A converter or the like with a reduced testing time.

What is claimed is:

1. A testing apparatus which tests a converter having functionality of converting an input signal and outputting the signal thus converted, said testing apparatus comprising:
   a clock generator which generates a measurement clock having a predetermined cycle;
   a pattern generator which generates said input signal inputted to the converter having approximately the same cycle as that of said measurement clock;
   a measurement unit which receives said measurement clock, and sequentially measures values of said signal outputted from said converter, synchronously with said measurement clock;
   a storage unit which stores, at different corresponding address, the values thus sequentially measured by said measurement unit; and
   a phase difference detection unit which detects the phase difference between the pulse of said input signal and the pulse of said measurement clock corresponding to said input signal pulse for each pulse, wherein, in the event that the phase difference between the pulse of said input signal and the pulse of said measurement clock is greater than a predetermined value, said storage unit does not store the value of said outputted signal measured by said measurement unit according to this particular pulse of said measurement clock.

2. A testing apparatus which tests a converter having functionality of converting an input signal and outputting the signal thus converted, said testing apparatus comprising:
   a clock generator which generates a measurement clock having a predetermined cycle;
   a pattern generator which generates said input signal inputted to said converter having approximately the same cycle as that of said measurement clock;
   a measurement unit which receives said measurement clock, and sequentially measures values of said signal outputted from said converter, synchronously with said measurement clock;
   a storage unit which stores, at different corresponding address, the values thus sequentially measured by said measurement unit; and
   a phase difference detection unit which detects the phase difference between the pulse of said input signal and the pulse of said measurement clock corresponding to said input signal pulse for each pulse, wherein, in the event that the phase difference between the pulse of said input signal and the pulse of said measurement clock is greater than a predetermined value, said storage unit stores the information which indicates that the value of said outputted signal is invalid, in correlation with the value of said outputted signal measured by said measurement unit according to this particular pulse of said measurement clock.

3. A testing apparatus which tests a converter having functionality of converting an input signal and outputting the signal thus converted, said testing apparatus comprising:
   a clock generator which generates a measurement clock having a predetermined cycle;
   a pattern generator which generates said input signal inputted to said converter having approximately the same cycle as that of said measurement clock;

a measurement unit which receives said measurement clock, and sequentially measures values of said signal outputted from said converter, synchronously with said measurement clock;

a storage unit which stores, at different corresponding address, the values thus sequentially measured by said measurement unit; and a determination unit which determines quality of the converter based upon the values stored in the storage unit, wherein the determination unit determines the quality of the converter on the basis whether or not each value of said outputted signal measured by said measurement unit is within a predetermined range determined beforehand corresponding to said input signal, wherein, in the event that said pattern generator has determined that the values of said outputted signal are not within said range, said pattern generator further input signal having said predetermined pattern to said converter.

* * * * *